(12) United States Patent
Kawai et al.

(10) Patent No.: US 9,829,551 B2
(45) Date of Patent: Nov. 28, 2017

(54) RF COIL UNIT AND MRI APPARATUS

(75) Inventors: Takuma Kawai, Nasushiobara (JP); Makoto Kato, Higashiokitama-Gun (KR); Sadanori Tomiha, Nasushiobara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1388 days.

(21) Appl. No.: 13/614,037

(22) Filed: Sep. 13, 2012

(65) Prior Publication Data

US 2013/0009644 A1  Jan. 10, 2013

Related U.S. Application Data

(63) Continuation of application No. PCT/JP2012/058679, filed on Mar. 30, 2012.

(30) Foreign Application Priority Data

Mar. 31, 2011  (JP) ................................ 2011-080351
Jun. 30, 2011  (JP) ................................ 2011-146630

(51) Int. Cl.
*G01V 3/00* (2006.01)
*G01R 33/36* (2006.01)
*G01R 33/3415* (2006.01)

(52) U.S. Cl.
CPC ........ *G01R 33/365* (2013.01); *G01R 33/3415* (2013.01)

(58) Field of Classification Search
CPC .................................................. G01R 33/365
USPC .................................................. 324/322, 318
See application file for complete search history.

(56) References Cited

U.S. PATENT DOCUMENTS

2008/0231278 A1* 9/2008 Ishihara ............... G01R 33/365
324/318
2009/0267600 A1* 10/2009 Okamoto ............. G01R 33/365
324/307

FOREIGN PATENT DOCUMENTS

| JP | 2006-141444 | 6/2006 |
| JP | 2008-264497 | 11/2008 |
| JP | 2010-119744 | 6/2010 |
| WO | WO 2008/078239 | 7/2008 |

OTHER PUBLICATIONS

International Preliminary Report on Patentability in PCT/JP2012/058679 dated Oct. 8, 2013.

* cited by examiner

*Primary Examiner* — Louis Arana
(74) *Attorney, Agent, or Firm* — Nixon & Vanderhye P.C.

(57) ABSTRACT

An RF coil unit of an embodiment includes a plurality of first coil elements each having a first main loop which receives a magnetic resonance signal and a plurality of second coil elements each having a second main loop and a sub-loop protruding from a portion of the second main loop. Any combination of two coil elements chosen from the plural first coil elements and the plural second coil elements is arranged in an overlap area where areas surrounded by one and another one of the two coil elements overlap in such a way that the overlap area is located in an area surrounded by the first main loop.

19 Claims, 17 Drawing Sheets

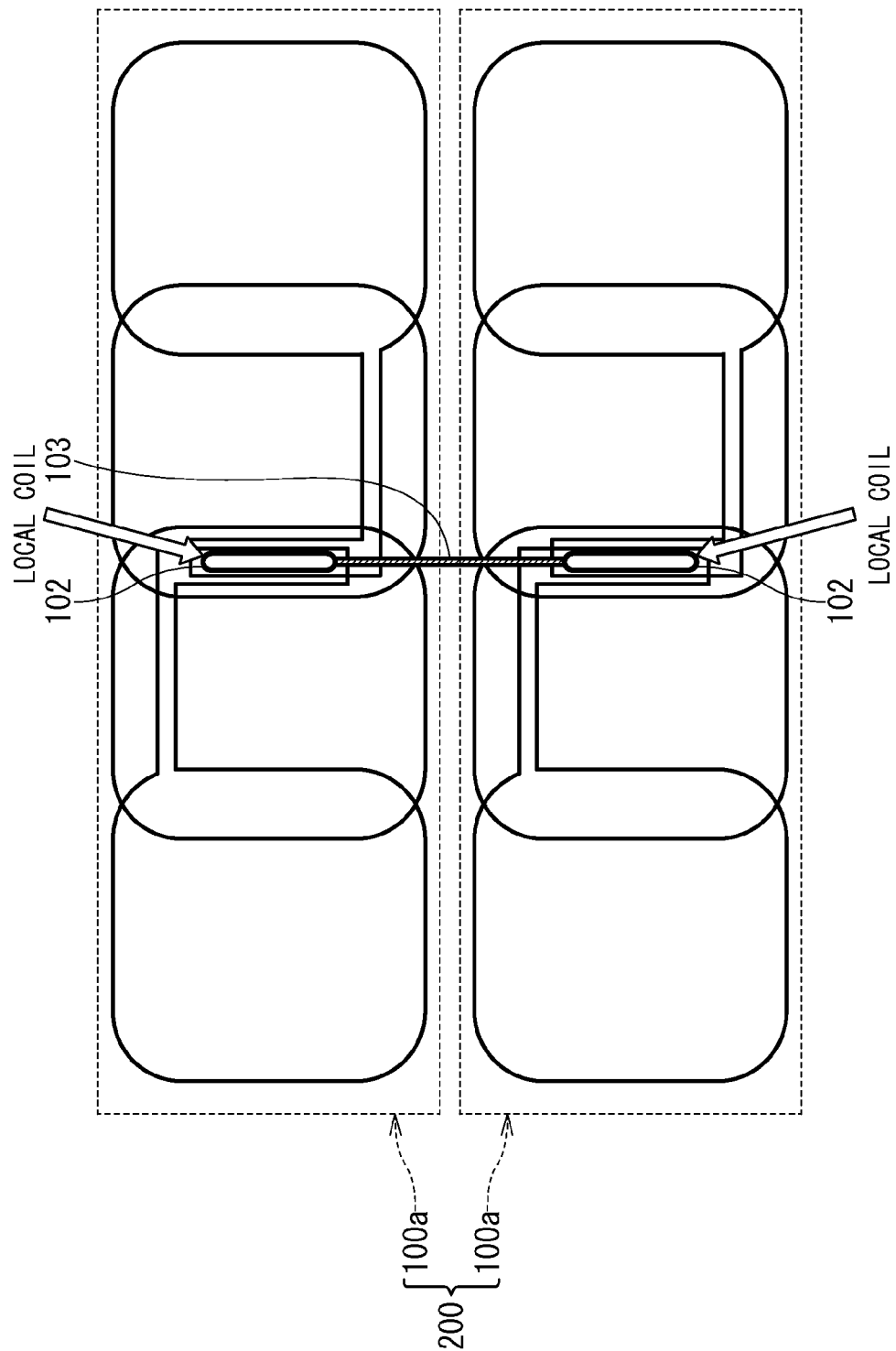

RF COIL UNIT AND MRI APPARATUS

CROSS-REFERENCE TO RELATED APPLICATIONS

This application is a Continuation Application of No. PCT/JP2012/058679, filed on Mar. 30, 2012, and the PCT application is based upon and claims the benefit of priority from Japanese Patent Applications No. 2011-080351 filed on Mar. 31, 2011 and No. 2011-146630 filed on Jun. 30, 2011, the entire contents of each of which are incorporated herein by reference.

FIELD

Embodiments of the invention relate to an RF coil unit and an MRI apparatus.

BACKGROUND

An MRI (Magnetic Resonance Imaging) apparatus which receives magnetic resonance signals coming from a test object by means of an RF coil unit formed by a plurality of coil elements is ordinarily known. As the MRI apparatus of this type performs a process for reconfiguring an image or image processing by using magnetic resonance signals received by the respective coil elements simultaneously in parallel, it is necessary that electric and magnetic interference caused among the respective coil elements be excluded as much as possible. That is, a decoupling technology for excluding couplings caused among the respective coil elements is important.

A method for overlapping adjacent coil elements is an effective way of decoupling the respective coil elements. Further, a technology for providing each of a pair of coil elements with a sub-loop for decoupling in addition to a main loop and for overlapping the sub-loops of the pair of coil elements is known as a method for decoupling a pair of coil elements located not adjacent to and apart from each other (as disclosed, e.g., in Japanese Unexamined Patent Publication No. 2008-264497).

Meanwhile, a flexible RF coil unit which can be bent and can veil a portion of a test object is being studied. Such an RF coil unit may include coil elements to be put apart from each other if the RF coil unit is being open and flat but put close in space to each other if the RF coil unit is bent in some cases. It is difficult to exclude possibility that all the coil elements of this kind of flexible RF coil unit are cross-coupled with one another.

The technology disclosed by Japanese Unexamined Patent Publication No. 2008-264497 is to decouple a particular pair included in the plural coil elements which form the RF coil unit, and coil elements which can be decoupled are limited.

Thus, an RF coil unit of higher decoupling performance and an MRI apparatus having such an RF coil unit are desired.

SUMMARY

An RF coil unit of an embodiment includes a plurality of first coil elements each having a first main loop which receives a magnetic resonance signal and a plurality of second coil elements each having a second main loop and a sub-loop protruding from a portion of the second main loop. Any combination of two coil elements chosen from the plural first coil elements and the plural second coil elements is located in such a way that areas surrounded by one and another one of the two coil elements overlap and that any one of the overlap areas is located in an area surrounded by the first main loop.

BRIEF DESCRIPTION OF DRAWINGS

FIG. 13 shows an exemplary structure of RF coil units located on two lines;

DESCRIPTION OF EMBODIMENTS

A multichannel RF signal switching device of the embodiment and an MRI apparatus having the multichannel RF signal switching device will be explained on the basis of the drawings below.

(1) Magnetic Resonance Imaging Apparatus

Figure 1:
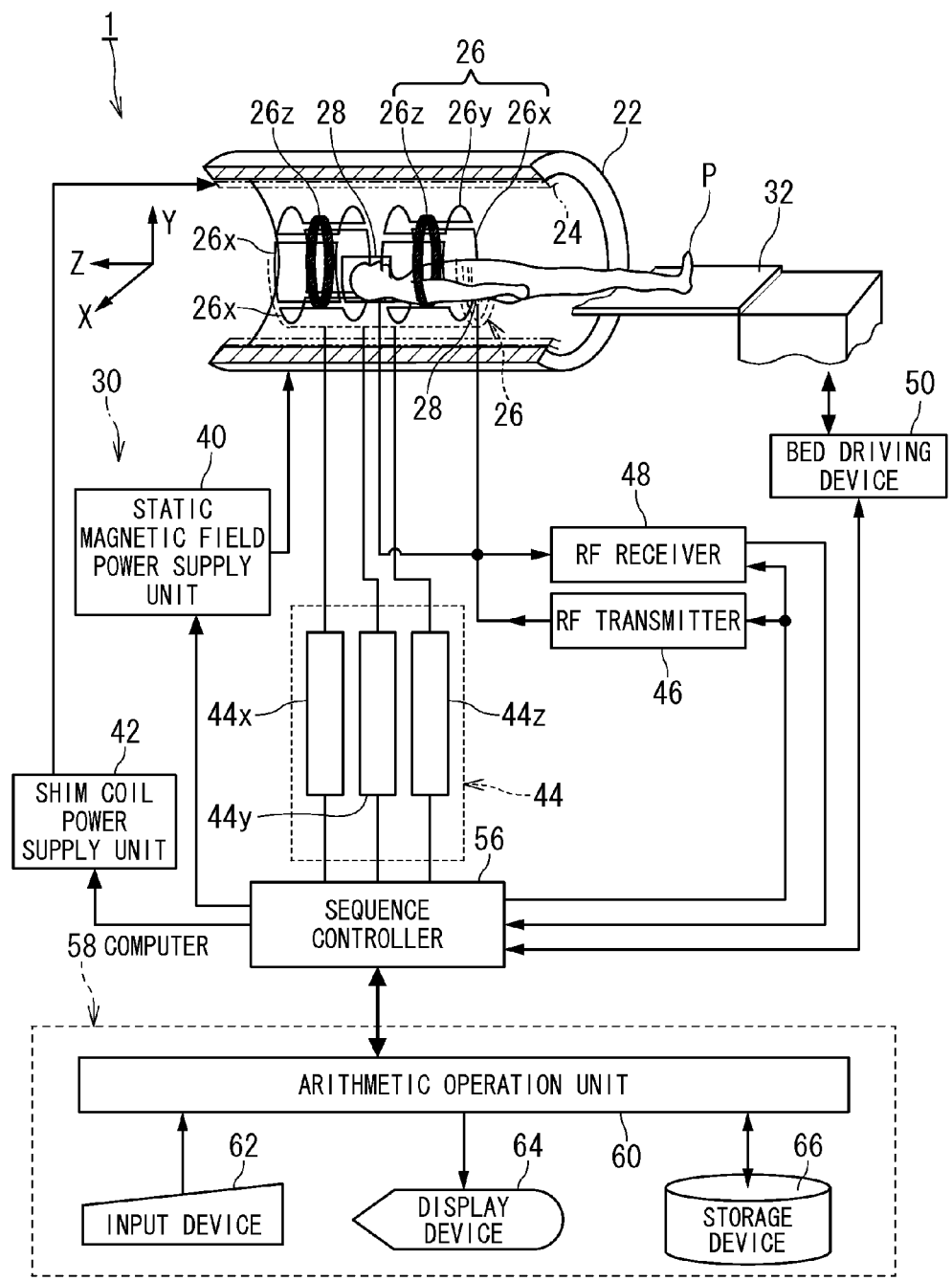
FIG. 1 shows an exemplary constitution of an MRI apparatus.

FIG. 1 is a block diagram which shows an entire constitution of a magnetic resonance imaging apparatus 1 (MRI apparatus 1) of the embodiment. As shown in FIG. 1, the magnetic resonance imaging apparatus 1 has a cylindrical magnet for static magnetic field 22 which forms a static magnetic field, a cylindrical shim coil 24 provided coaxially with and inside the magnet for static magnetic field 22, a gradient magnetic field coil 26, an RF coil 28, a control system 30 and a bed 32 on which a test object P can be mounted.

An exemplary coordinate system of the apparatus including X-, Y- and Z-axes which are perpendicular to one another is defined here, as follows. To begin with, suppose that the magnet for static magnetic field 22 and the shim coil 24 are arranged in such a way that their axial directions cross perpendicularly to the vertical direction, and that the axial directions of the magnet for static magnetic field 22 and the shim coil 24 are in the direction of the Z-axis. Suppose further that the vertical direction is the direction of the Y-axis, and that the bed 32 is arranged in such a way that the direction normal to a top mounting plate of the bed 32 is in the direction of the Y-axis.

The control system 30 has a static magnetic field power supply unit 40, a shim coil power supply unit 42, a gradient magnetic field power supply unit 44, an RF transmitter 46, an RF receiver 48, a bed driving device 50, a sequence controller 56 and a computer 58.

The gradient magnetic field power supply unit 44 is formed by an X-axis gradient magnetic field power supply unit 44x, a Y-axis gradient magnetic field power supply unit 44y and a Z-axis gradient magnetic field power supply unit 44z. Further, the computer 58 is formed by an arithmetic operation device 60, an input device 62, a display device 64 and a storage device 66.

The magnet for static magnetic field 22 is connected to the static magnetic field power supply unit 40, and forms a static magnetic field in imaging space by means of an electric current supplied by the static magnetic field power supply unit 40. The shim coil 24 is connected to the shim coil power supply unit 42, and levels the static magnetic field off by means of an electric current supplied by the shim coil power supply unit 42. The magnet for static magnetic field 22 is formed by a superconductive coil in lots of cases. The magnet for static magnetic field 22 is connected to the static magnetic field power supply unit 40 and is supplied with an electric current in time of excitation, and is usually disconnected once having been excited. Incidentally, the magnet for static magnetic field 22 may be formed by a permanent magnet without being provided with the static magnetic field power supply unit 40.

The gradient magnetic field coil 26 has an X-axis gradient magnetic field coil 26x, a Y-axis gradient magnetic field coil 26y and a Z-axis gradient magnetic field coil 26z. The gradient magnetic field coil 26 is shaped like a cylinder inside the magnet for static magnetic field 22. The X-, Y- and Z-axis gradient magnetic field coils 26x, 26y and 26z are connected to the X-, Y- and Z-axis gradient magnetic field power supply units 44x, 44y and 44z, respectively.

The X-, Y- and Z-axis gradient magnetic field power supply units 44x, 44y and 44z each provide the X-, Y- and Z-axis gradient magnetic field coils 26x, 26y and 26z with an electric current, respectively, so that gradient magnetic fields Gx, Gy and Gz are formed in the directions of the X-, Y- and Z-axes in the imaging space, respectively.

That is, the gradient magnetic fields Gx, Gy and Gz in three directions in the apparatus coordinate system are combined, so that logical axes which are a slice direction gradient magnetic field Gss, a phase encode direction gradient magnetic field Gpe and a read out direction (frequency encode direction) gradient magnetic field Gro each can be set in any direction. The static magnetic field is overlaid with each of the gradient magnetic fields in the slice, phase encode and read out directions.

The RF transmitter 46 generates an RF pulse (RF current pulse) of a Larmor frequency for producing a nuclear magnetic resonance on the basis of control information provided by the sequence controller 56, and transmits the RF pulse to the RF coil 28 for transmission. The RF coil 28 may be a whole body coil (WBC) for transmitting and receiving an RF pulse contained in a gantry, or a local coil for receiving an RF pulse provided close to the bed 32 or the test object P. The RF coil 28 for transmission receives an RF pulse from the RF transmitter 46 and transmits the RF pulse to the test object P. The RF coil 28 for receiving receives an MR signal (magnetic resonance signal) produced as a result of a nuclear spin excited by the RE pulse inside the test object P. The MR signal is detected by the RF receiver 48.

The RF receiver 48 carries out various kinds of data processing such as pre-amplification, intermediate frequency conversion, phase detection, baseband frequency amplification, filtering and so on for the detected MR signal, and then A/D (analog to digital)-converts the MR signal so as to generate raw data which is digitized complex data. The RE receiver 48 outputs the produced raw data of the MR signal to the sequence controller 56.

The arithmetic operation device 60 controls the entire magnetic resonance imaging apparatus 1 as a system.

The sequence controller 56 stores therein control information necessary for driving the gradient magnetic field power supply unit 44, the RF transmitter 46 and the RF receiver 48 as instructed by the arithmetic operation device 60. The control information mentioned here is, e.g., sequence information such that operation control information related to strength, a period of application or timing of application of a pulse current to be applied to the gradient magnetic field power supply unit 44 is written.

The sequence controller 56 drives the gradient magnetic field power supply unit 44, the RF transmitter 46 and the RF receiver 48 in accordance with a stored particular sequence so as to generate the gradient magnetic fields on the X-, Y- and Z-axes Gx, Gy and Gz, respectively, and an RF pulse. Further, the sequence controller 56 receives raw data of an MR signal provided by the RF receiver 48, and provides the arithmetic operation device 60 with the received raw data of the MR signal.

Figure 2:
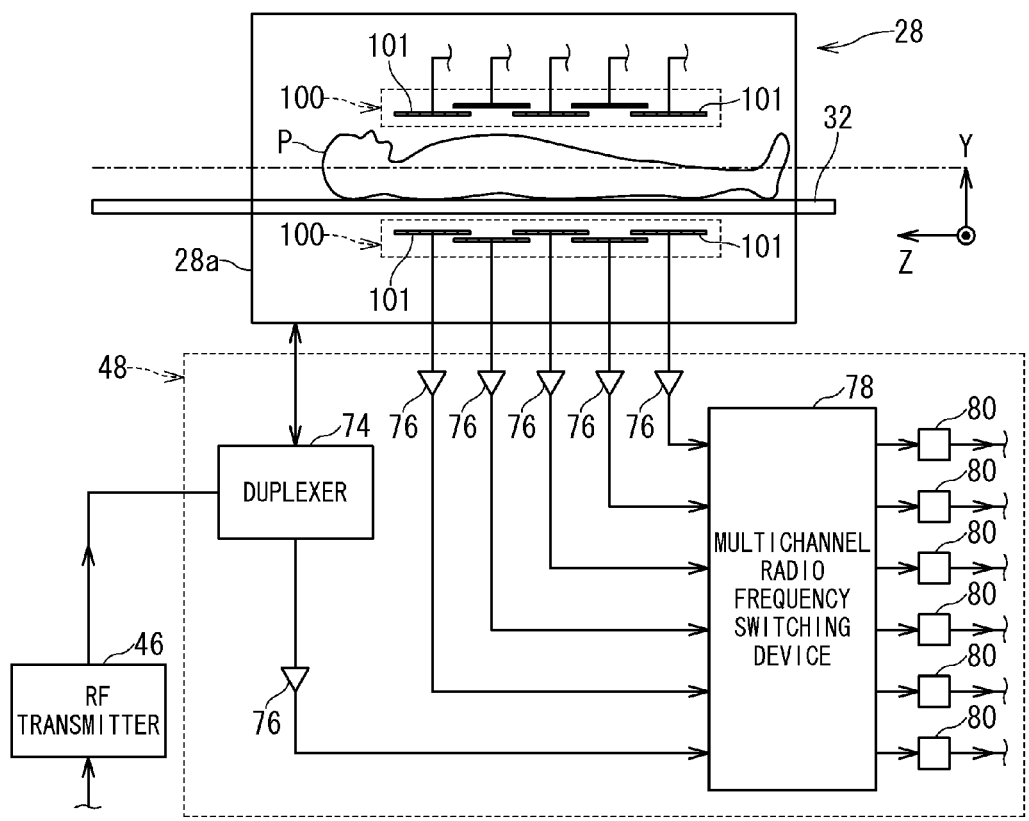
FIG. 2 shows connections related to and around RF coil units in the MRI apparatus.

FIG. 2 shows an exemplary detailed constitution of the RF coil 28. As shown in FIG. 2, the RF coil 28 includes a cylindrical coil for the whole body 28a (indicated with a bold rectangle in FIG. 2) and an RF coil unit 100. The coil for the whole body 28a can be used as a coil for transmitting an RF pulse, and as a coil for receiving an MR signal as well. The RF coil unit 100 is put close to the test object P, e.g., on the front side or on the back side as shown in FIG. 2, and close to a head portion, a wrist, etc., as well. The RF coil unit 100 is formed by lots of coil elements 101. The coil elements 101 are each used as a coil for receiving a magnetic resonance signal (MR signal). The RF coil unit 100 will be described in detail later.

The RF receiver 48 has a duplexer 74, a plurality of amplifiers 76, a multichannel RF signal switching device and a plurality of receiving circuits 80. The multichannel RE signal switching device 78 has an input side connected to the respective coil elements 101 and the coil for the whole body 28a via a connector. Further, the receiving circuits 80 are each separately connected to an output side of the multichannel RF signal switching device 78.

The duplexer 74 provides the coil for the whole body 28a with an RF pulse transmitted by the RF transmitter 46. Further, the duplexer 74 provides one of the amplifiers 76 with the MR signal received by the coil for the whole body 28a. The MR signal is amplified by the relevant amplifier 76 and is provided to the input side of the multichannel RF signal switching device 78. Further, the MR signals received by the respective coil elements 101 are each amplified by corresponding one of the amplifiers 76 and provided to the input side of the multichannel RF signal switching device 78.

The multichannel RF signal switching device 78 switches over the MR signals detected by the respective coil elements 101 and the coil for the whole body 28a according to the number of the receiving circuits 80, and outputs the MR signals separately to the corresponding receiving circuits 80. The magnetic resonance imaging apparatus 1 forms a sensitivity distribution map corresponding to each of imaging target parts by using the coil for the whole body 28a and a desirable number of the coil elements 101, and receives MR signals coming from various imaging target parts in this way.

(2) RF Coil Unit

Figure 3:
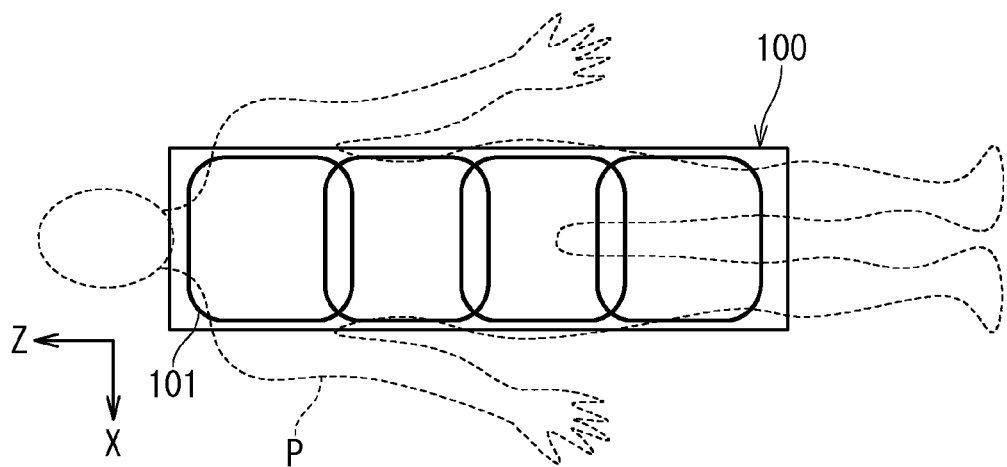
FIG. 3 is a first diagram which shows an exemplary position of an RF coil unit relative to a test object.

FIG. 3 is a conceptual diagram of the RF coil unit 100 provided on the front side or on the back side of the test object P. The exemplary RF coil unit 100 shown in FIG. 3 includes four coil elements 101 lined up along a body length axis of the test object P.

Figure 4:
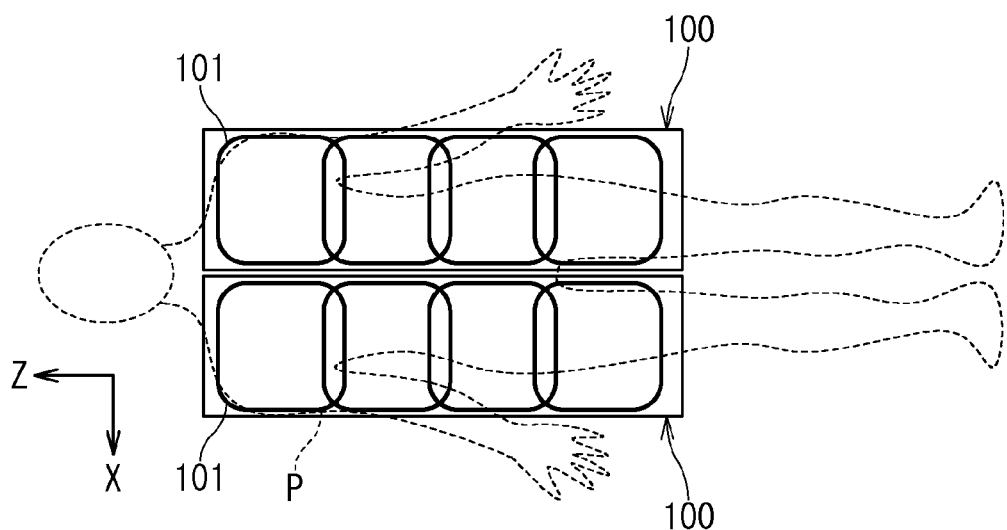
FIG. 4 is a second diagram which shows an exemplary position of an RF coil unit relative to a test object.

Meanwhile, FIG. 4 shows an example in which two of the RF coil units which are each same as that shown in FIG. 3 are arranged in parallel. The RF coil unit 100 of the embodiment is formed by including a first coil element 101a formed by a main loop only and a second coil element 101b formed by main and sub-loops mixed with each other as described later (e.g., see FIG. 7). A portion of the sub-loop is omitted to be shown in FIGS. 3 and 4, though.

Although the numbers of the coil elements 101 included in each of the exemplary RF coil units 100 being lined up as shown in FIGS. 3 and 4 is four, the number of the coil elements 101 is not limited to four. Further, although the RF coil units 100 shown in FIGS. 3 and 4 are each shaped substantially flat along the body length axis, the shape of the RF coil unit 100 is not limited to flat. It is conceivable to bend a flexible sheet-like RF coil unit 100 along the shape of the imaging target parts of the test object P (e.g., head portion, leg, wrist, etc.)

Figure 5:
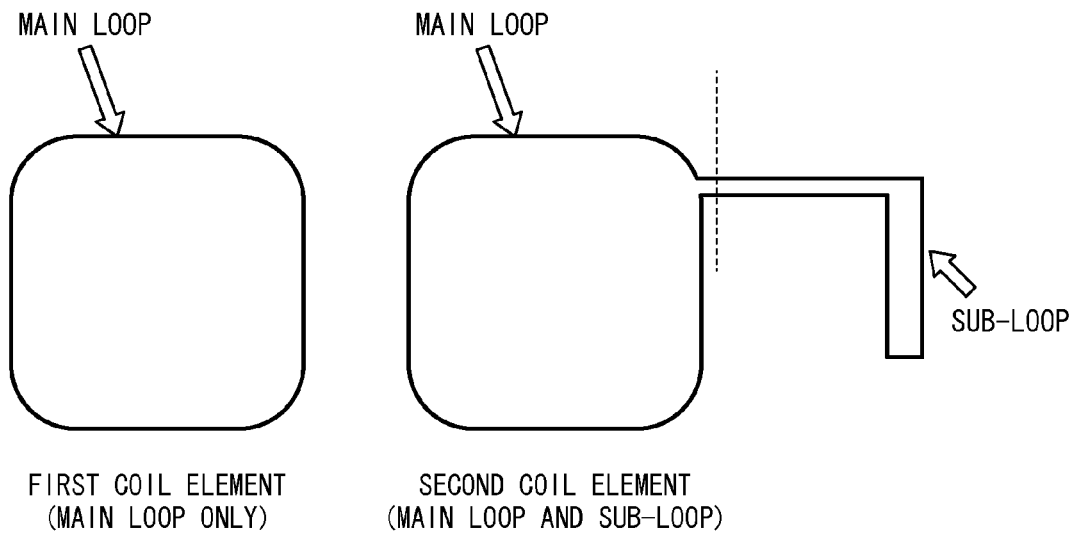
FIG. 5 schematically shows a first coil element and a second coil element.

FIG. 5 schematically shows two types of the coil element 101 to be used for the RF coil unit 100 of the embodiment. FIG. 5 shows a first coil element 101a formed by a main loop only for receiving a magnetic resonance signal and a second coil element 101b formed by main and sub-loops on the left hand side and on the right hand side, respectively. The main loops of the first and second coil elements 101a and 101b (e.g., see FIG. 7) are aimed at receiving an MR signal coming from the test object P. Meanwhile, the sub-loop of the second coil element 101b is aimed at decoupling the coil elements 101 with one another. As shown on the right hand side in FIG. 5, the sub-loop protrudes from a portion of the main loop and the main and sub-loops are connected with each other in series.

If an RF coil unit is arranged in a linear or planar array by the use of a plurality of coil elements, the coil elements may possibly be electromagnetically coupled with one another, i.e., possibly cause a coupling. A coupling caused between the coil elements results in various kinds of undesirable phenomena such as a degraded SNR. Thus, it is one of important technical issues for the RF coil unit to decouple the coil elements with one another.

The RF coil unit 100 of the embodiment is formed by including a plurality of first coil elements 101a and a plurality of second coil elements 101b. Further, any combination of two coil elements chosen from the plural first coil elements 101a and the plural second coil elements 101b is arranged in such a way, without exception, that areas surrounded by the one and the other coil elements of the combination overlap. This structure allows a good performance in decoupling any two of the coil elements 101 with each other to be achieved. Further, the overlap area is supposed to be arranged inside an area surrounded by the main loop. The overlap area, e.g., where the sub-loops of the second coil elements 101b overlap is provided inside one of their main loops so that a perimeter of the RF coil unit 100 does not stick to the outside and the RF coil unit 100 can use space more efficiently.

Two of the coil elements 101 can be decoupled by means of an overlap between areas surrounded by the respective coil elements 101. FIG. 6 conceptually explains a theory of operation of such decoupling.

Figure 6B:
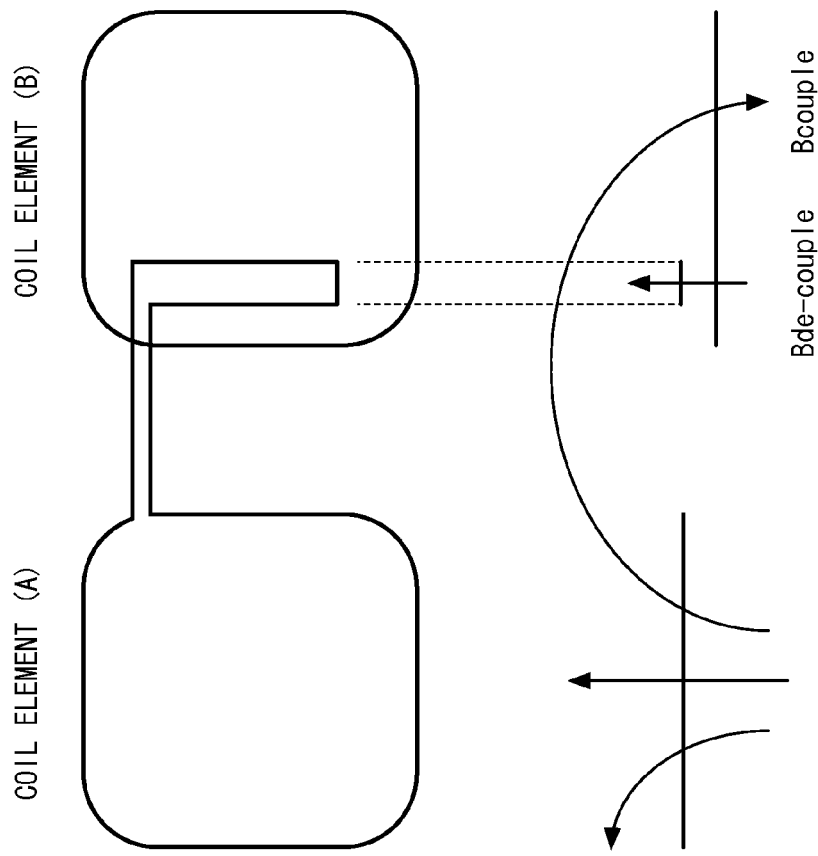
FIGS. 6A and 6B explain a theory of decoupling due to an overlap between the RF coil elements.
Figure 6A:
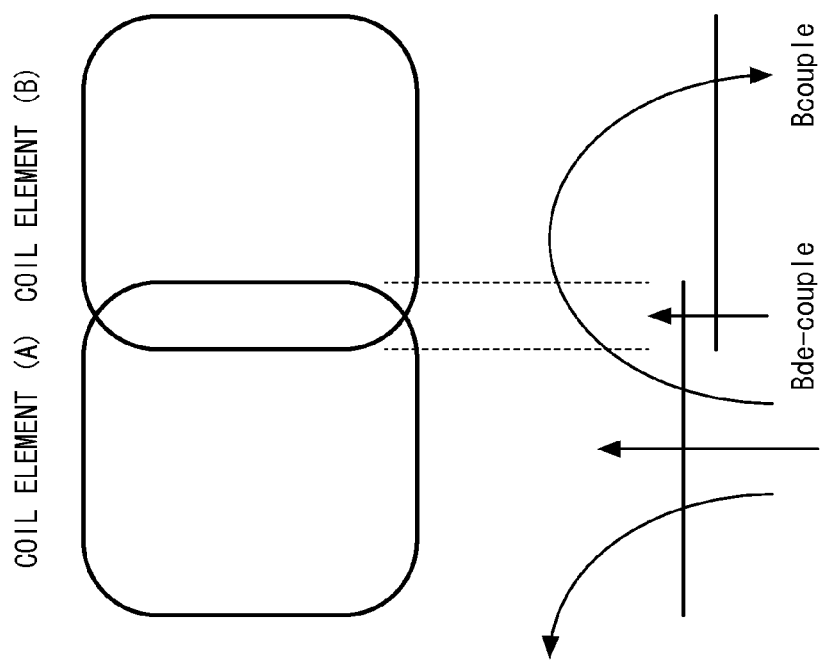

FIG. 6A shows a case where coil elements (A) and (B) are adjacent to each other. Their main loops can overlap in this case. In an assumption that a current (RF current) flows only through the coil element (A), it can be concluded that the coil elements (A) and (B) are entirely decoupled with each other if an induced current which flows through the coil element (B) falls to zero. As shown in a lower portion of FIG. 6A, the current which flows through the coil element (A) causes magnetic fields which are partially directed to the coil element (B). A magnetic field (magnetic flux density) Bde-couple in the area where the two coil elements overlap and a magnetic field Bcouple in the area where the two coil elements do not overlap are directed in opposite directions. Thus, adjusting a size of the area where the two coil elements overlap means that a total of the magnetic fields (magnetic flux) which cross the coil element (B) can be reduced. As a result, the induced current which flows through the coil element (B) can be made fall to zero and the coil elements (A) and (B) can be decoupled with each other.

Meanwhile, FIG. 6B shows a case where the coil elements (A) and (B) are not adjacent to (separate from) each other. Although the main loops cannot overlap in this case, providing the coil element (A) with a sub-loop means that an overlap area where the sub-loop of the coil element (A) and the main loop of the coil element (B) overlap can be secured. The crossing magnetic field Bde-couple in the overlap area and the crossing magnetic field Bcouple in the area where the two coil elements do not overlap are directed in opposite directions similarly as in FIG. 6(A). Adjusting a size of the overlap area (size of the area of the sub-loop in this case) means that the coil elements (A) and (B) can be decoupled with respect to each other.

If both the coil elements (A) and (B) each have a sub-loop, the sub-loops can overlap so that the coil elements (A) and (B) are decoupled with respect to each other according to a similar theory of operation, although not particularly shown in the drawings.

Figure 7:
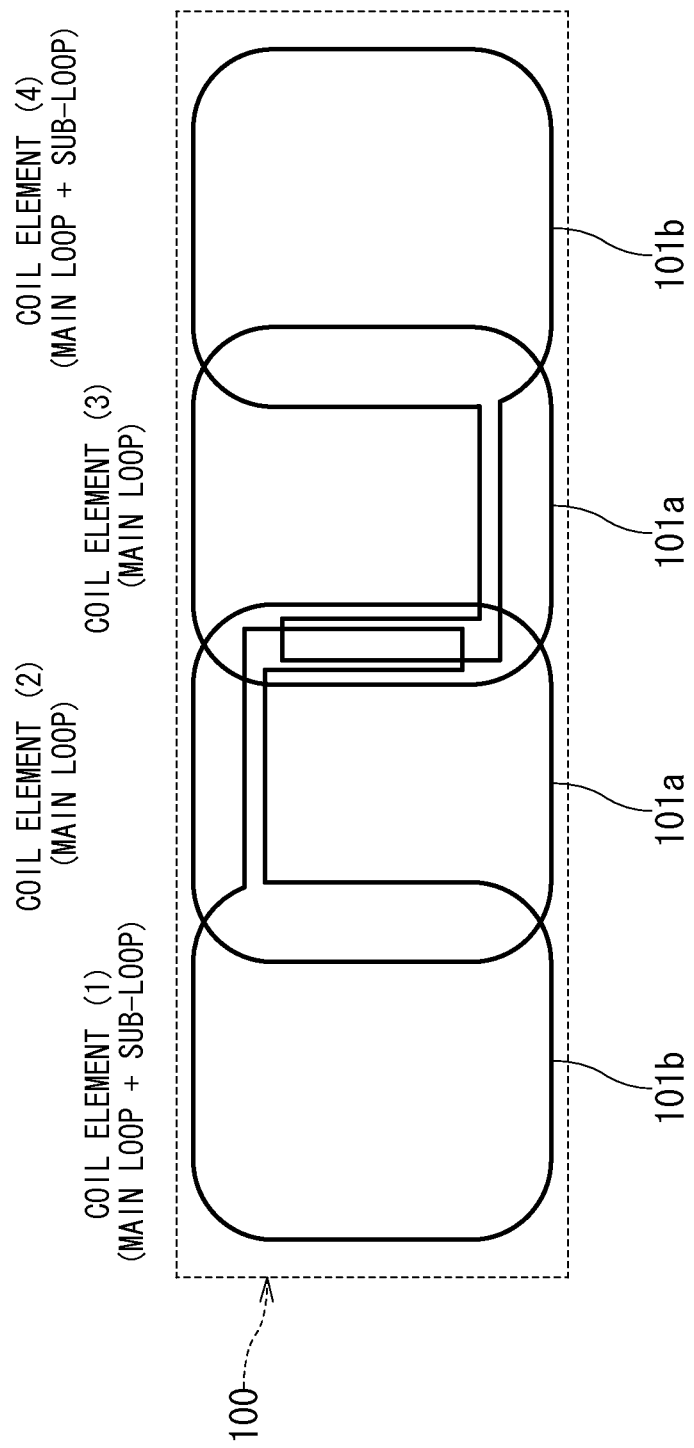
FIG. 7 shows a first exemplary coil unit (including four coil elements)

FIG. 7 shows an exemplary RF coil unit 100 including four coil elements (1) through (4) being lined up. The two coil elements (2) and (3) of the example arranged in the middle are each a first coil element 101a having a main loop only. The coil elements (1) and (4) arranged at both ends are each a second coil element 101b having a main loop and a sub-loop. Further, all the coil elements (1) through (4) overlap in the middle of the RF coil unit 100 of the example. Then, the area where all the coil elements overlap is set in such a way as to include a particular one and the same area in the middle of the RF coil unit 100.

Figure 8A:
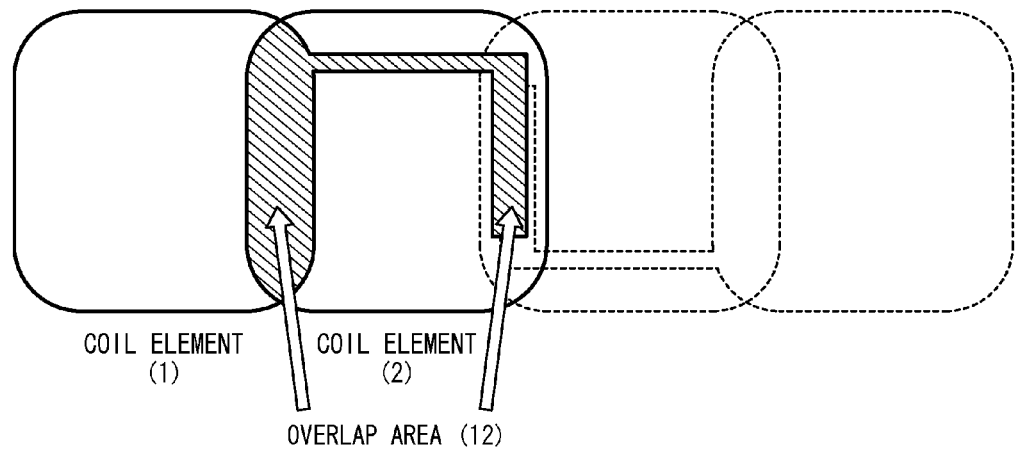
FIGS. 8A and 8B are first diagrams which show an overlap between any two of the coil elements.
Figure 8B:
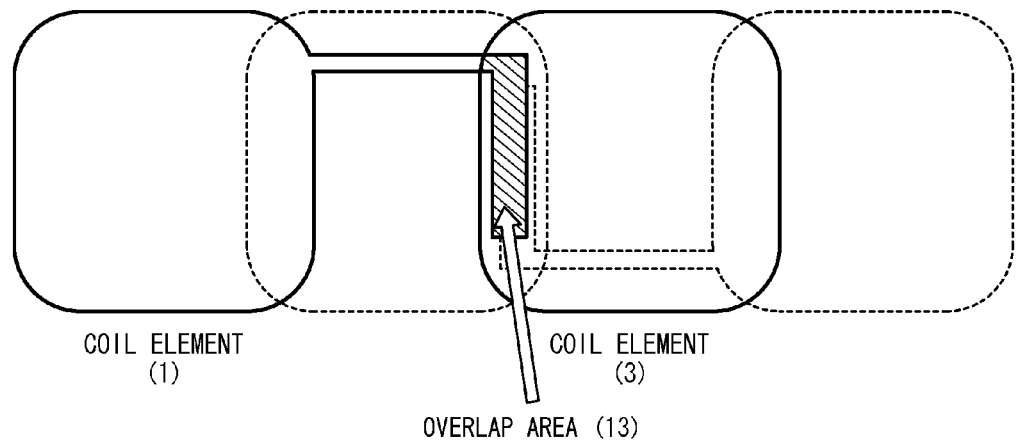
Figure 9A:
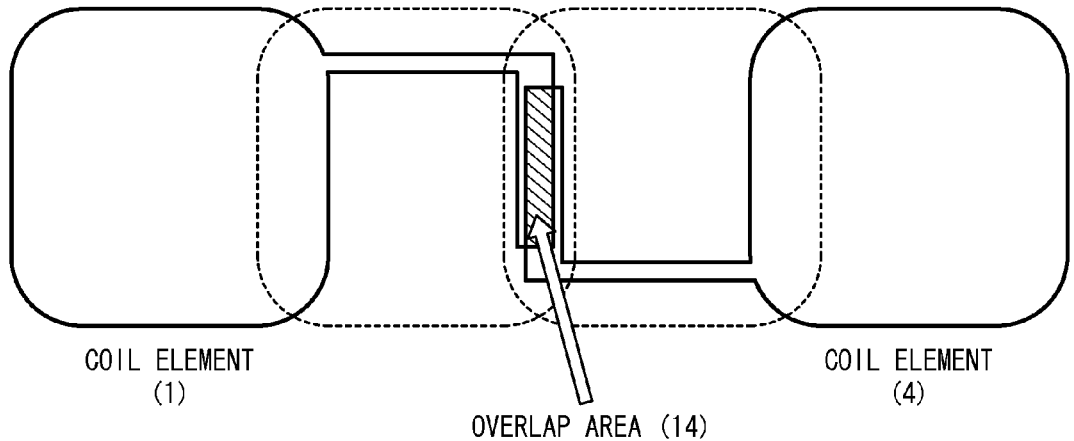
FIGS. 9A and 9B are second diagrams which show an overlap between any two of the coil elements.
Figure 9B:
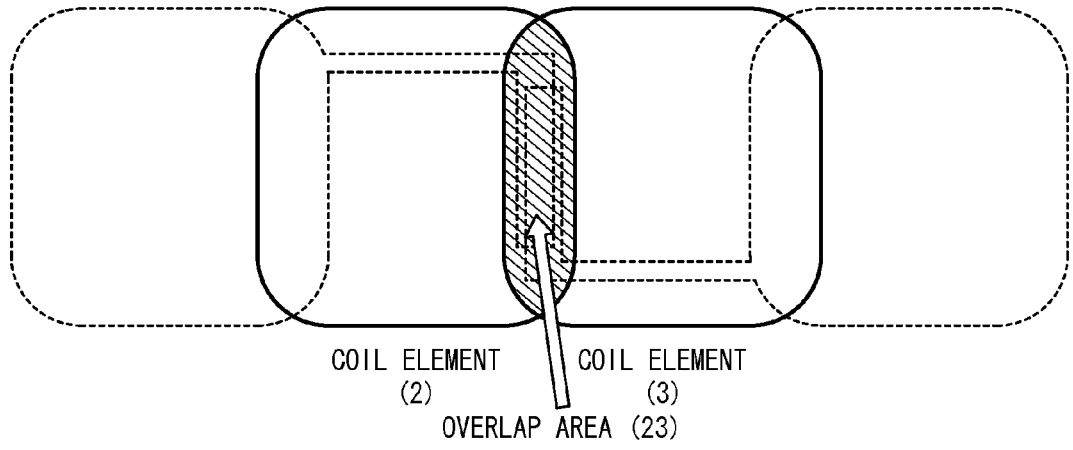
Figure 10A:
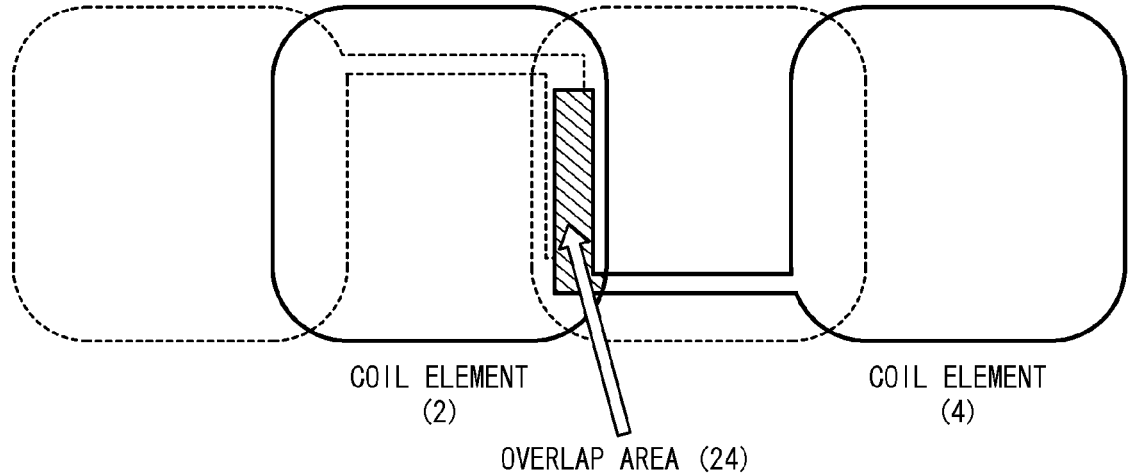
FIGS. 10A and 10B are third diagrams which show an overlap between any two of the coil elements.
Figure 10B:
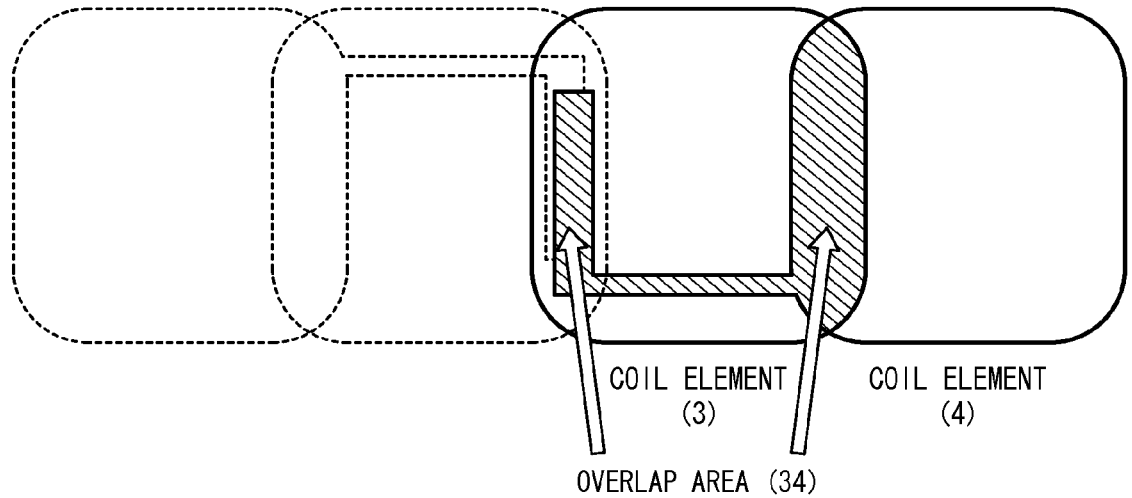

FIGS. 8-10 specifically show how the coil elements are decoupled with one another in the RF coil unit 100 shown in FIG. 7. The coil elements (1) and (2) can be decoupled with each other by the adjustment of the size of an overlap area (12) of both the coil elements (1) and (2) (as shown in FIG. 8A). The coil elements (1) and (3) can be decoupled with each other by the adjustment of the size of an overlap area (13) of both the coil elements (1) and (3) overlap (as shown in FIG. 8B). The coil elements (1) and (4) can be decoupled with each other by the adjustment of the size of an overlap area (14) of both the coil elements (1) and (4) (as shown in FIG. 9A). The coil elements (2) and (3) can be decoupled with each other by the adjustment of the size of an overlap area (23) of both the coil elements (2) and (3) (as shown in FIG. 9B). The coil elements (2) and (4) can be decoupled with each other by the adjustment of the size of an overlap area (24) of both the coil elements (2) and (4) (as shown in FIG. 10A). The coil elements (3) and (4) can be decoupled with each other by the adjustment of the size of an overlap area (34) of both the coil elements (3) and (4) (as shown in FIG. 10B).

The main loops, the sub-loops or a set of the main and sub-loops of any two of the coil elements (1) through (4) (of every combination of two of them) overlap without exception as described above, so that any two of the coil elements (1) through (4) can be decoupled with each other.

In the exemplary structure shown in FIG. 7, two of the first coil elements 101a are arranged in the middle, and the second coil elements 101b are arranged as all (two, for this example) of the outer coil elements 101. Then, all the sub-loops of the outer second coil elements 101b are concentrated on the overlap area of the inner two main loops. Even if the total number of the coil elements 101 is more than four, a similar structure is allowable as long as the number of the coil elements 101 is even.

Figure 11:
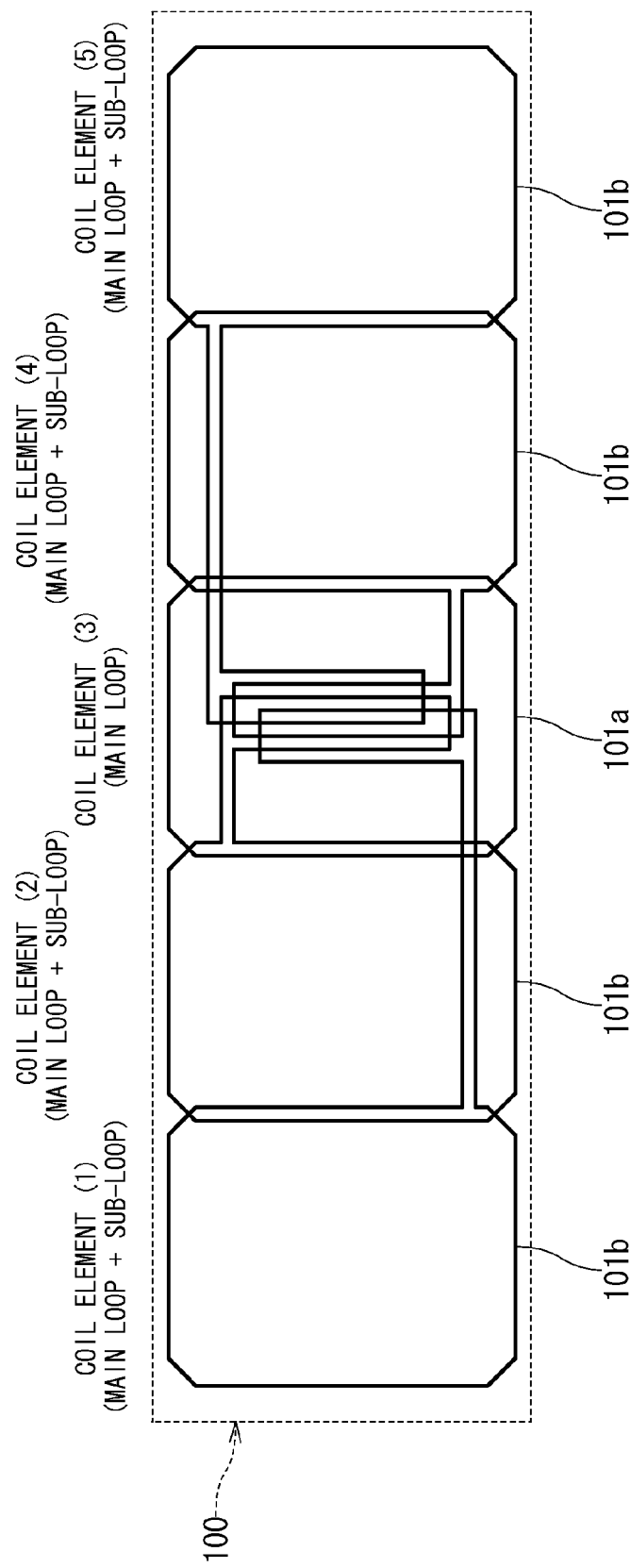
FIG. 11 shows a second exemplary coil unit (including five coil elements)

FIG. 11 shows an exemplary RF coil 100 including five coil elements (1) through (5) being lined up. The coil element (3) of the example arranged in the middle is a first coil element 101a having a main loop only. The coil elements (1), (2), (4) and (5) arranged not in the middle are each a second coil element 101b having a main loop and a sub-loop. The RF coil unit 100 shown in FIG. 11 is structured in such a way that all the sub-loops of the coil elements (1), (2), (4) and (5) overlap substantially in the middle of the main loop of the center-located coil element (3). Even if the total number of the coil elements 101 is more than five, a similar structure is allowable as long as the number of the coil elements 101 is odd.

The main loops, the sub-loops or a set of the main and sub-loops of any two of the coil elements (1) through (5) of the structure shown in FIG. 11 overlap without exception, so that any two of the coil elements (1) through (5) can be decoupled with each other.

Figure 12:
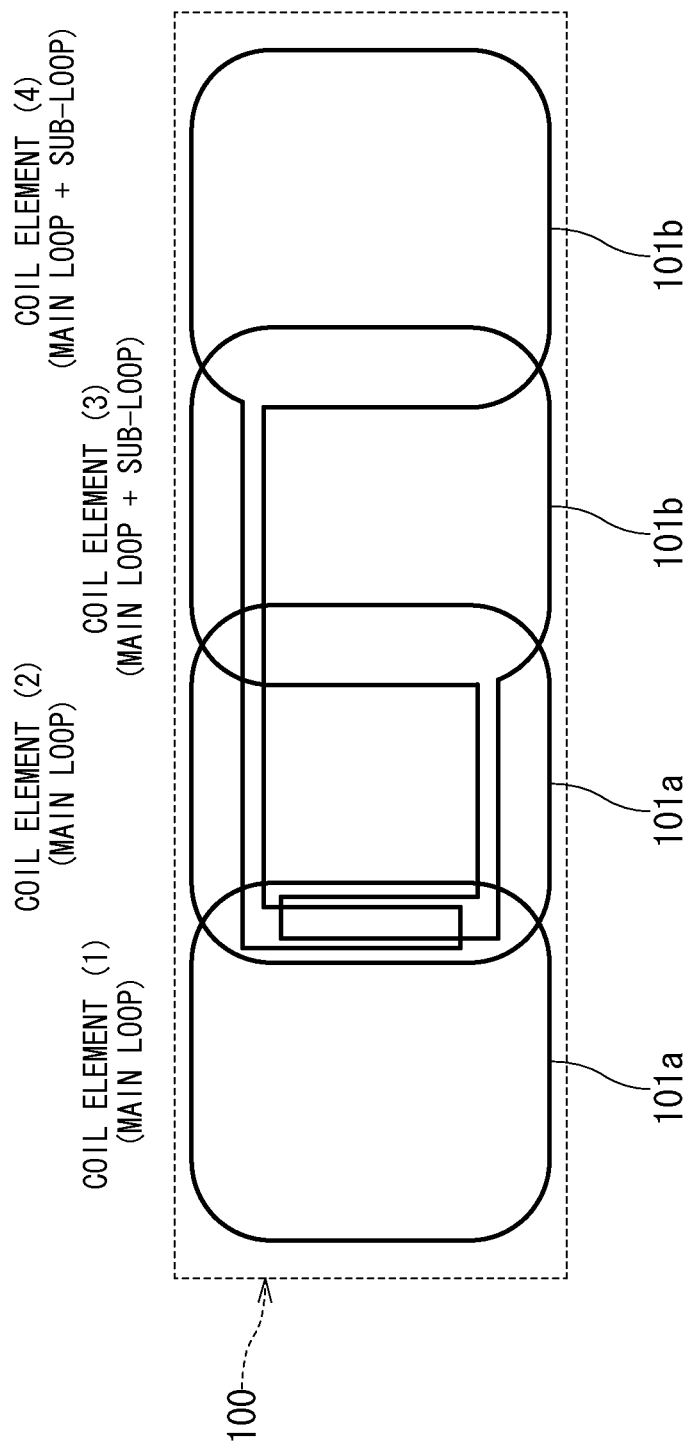
FIG. 12 shows a third exemplary coil unit (including four coil elements)

The RF coil unit 100 shown in FIG. 7 or 11 is structured in such a way that the sub-loops are concentrated and overlap in the middle of the RF coil unit 100, where what is located substantially in the middle is supposed to be located in the middle. Further, the sub-loops may be concentrated and overlap in the middle or off the middle of the RF coil unit 100. As shown in FIG. 12, e.g., the location where the sub-loops are concentrated and overlap may be shifted to the left from the middle of the RF coil unit 100 and set there. Incidentally, the number of the coil elements 101 of the exemplary structure shown in FIG. 12 may be even or odd.

The main loops, the sub-loops or a set of the main and sub-loops of any two of the coil elements (1) through (4) of the structure shown in FIG. 12 overlap without exception, so that any two of the coil elements (1) through (4) can be decoupled with each other.

FIG. 13 shows a plurality (e.g., two in FIG. 13) of RF coil units 100a forming a multiple RF coil unit 200, each being formed by the RF coil unit 100 shown in FIG. 7 and a local coil 102 added thereto arranged in lines. The local coil 102 is arranged in an area where the respective coil elements 101 are concentrated and overlap in the middle of the RF coil unit 100a. Then, the local coils of the respective RF coil units 100a are electrically coupled with one another via a line 103. The line 103 may be formed by a coaxial cable, parallel lines or twisted pair lines. As the overlap areas in the respective coil elements 100a of the multiple RF coil unit 200 are coupled with one another via the local coils 102 and the line 103, all the respective coil elements 101 of the two multiple RF coil units 100a equivalently overlap, so that any two of all the coil elements 101 in the two RF coil units 100a can be decoupled with each other.

Further, the number of turns of each of the local coils 102 is not limited to one, and may be plural. The number of turns of the local coil 102 being plural is adjusted so that an equivalent size of the overlap area can be adjusted even if a physical size of the overlap area 100a is small in each of the RF coil units and that the respective coil elements 101 can be decoupled with one another.

Although the RF coil unit 100 having been explained so far is supposed to be planar in shape as a whole, the shape of the RF coil unit 100 is not limited to a plane. Suppose that the RF coil unit 100 is a flexible sheet-like unit so as to flexibly bend the RF coil unit 100 and to cover imaging target parts such as head, leg and wrist portions of the test object along the curved surface of the RF coil unit 100.

Figures 14A, 14D:
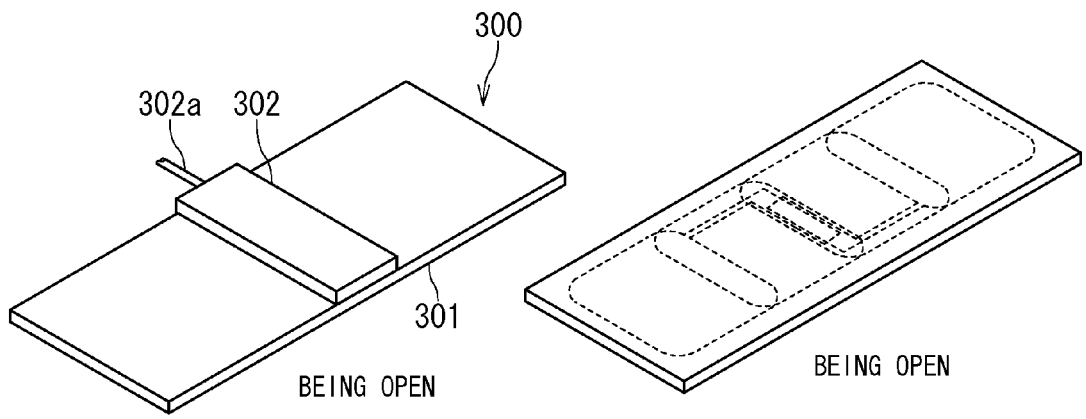
FIGS. 14A to 14E show an exemplary structure of a flexible RF coil unit.
Figures 14B, 14E:
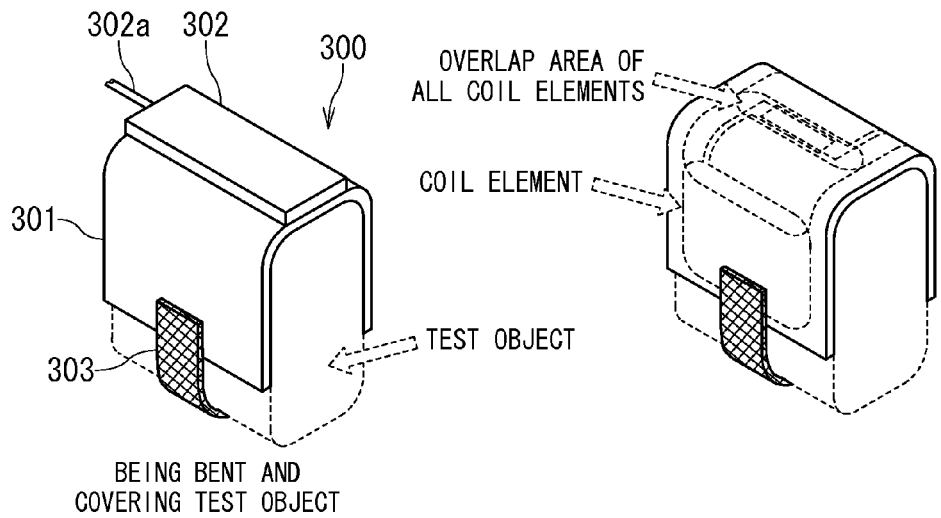
Figure 14C:
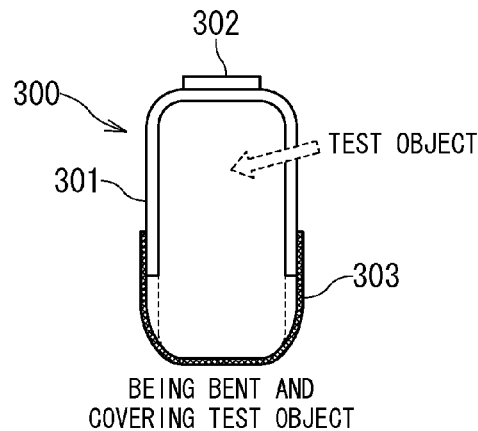

FIG. 14 shows an exemplary RF coil unit 300 which is flexible as described above. FIG. 14A is a perspective diagram in which the RF coil unit 300 is being open. FIG. 14B is a perspective diagram in which the RF coil unit 300 is bent along the test object. FIG. 14 C gives a side view of what is drawn in FIG. 14B. Further, FIGS. 14D and 14E correspond to FIGS. 14A and 14B, respectively, and each illustrate relative positions of the coil elements 101 inside the RF coil unit 300.

The RF coil unit 300 has a unit body 301, a preamplifier unit 302 and a holding member 303. The unit body 301 is a flexible sheet-like unit including a plurality of the coil elements 101 described above. The holding member 303 is a flexible belt-like member. Stick both ends of the holding member 303 individually to both ends of the unit body 301, e.g., by means of Velcro™, etc., so as to fix the unit body 301 being bent along the test object.

The main loops, the sub-loops or a set of the main and sub-loops of any two of the respective coil elements of the RE coil unit 300 overlap without exception as shown in FIG. 14E, so that any two of the respective coil elements can be decoupled with each other.

The preamplifier unit 302 couples the respective coil elements 101 with the outside via a complex cable 302a. The preamplifier unit 302 is not limited to what is mounted on the RF coil unit 300 which is flexible or bent as shown in FIGS. 14A-14E, and can be mounted on all the RF coil units 100 and 200 of the embodiment shown in FIGS. 7, 11-13, etc. FIGS. 15-18 illustrate arrangements, a constitution, etc., of the preamplifier unit 302 more specifically.

Figure 15:
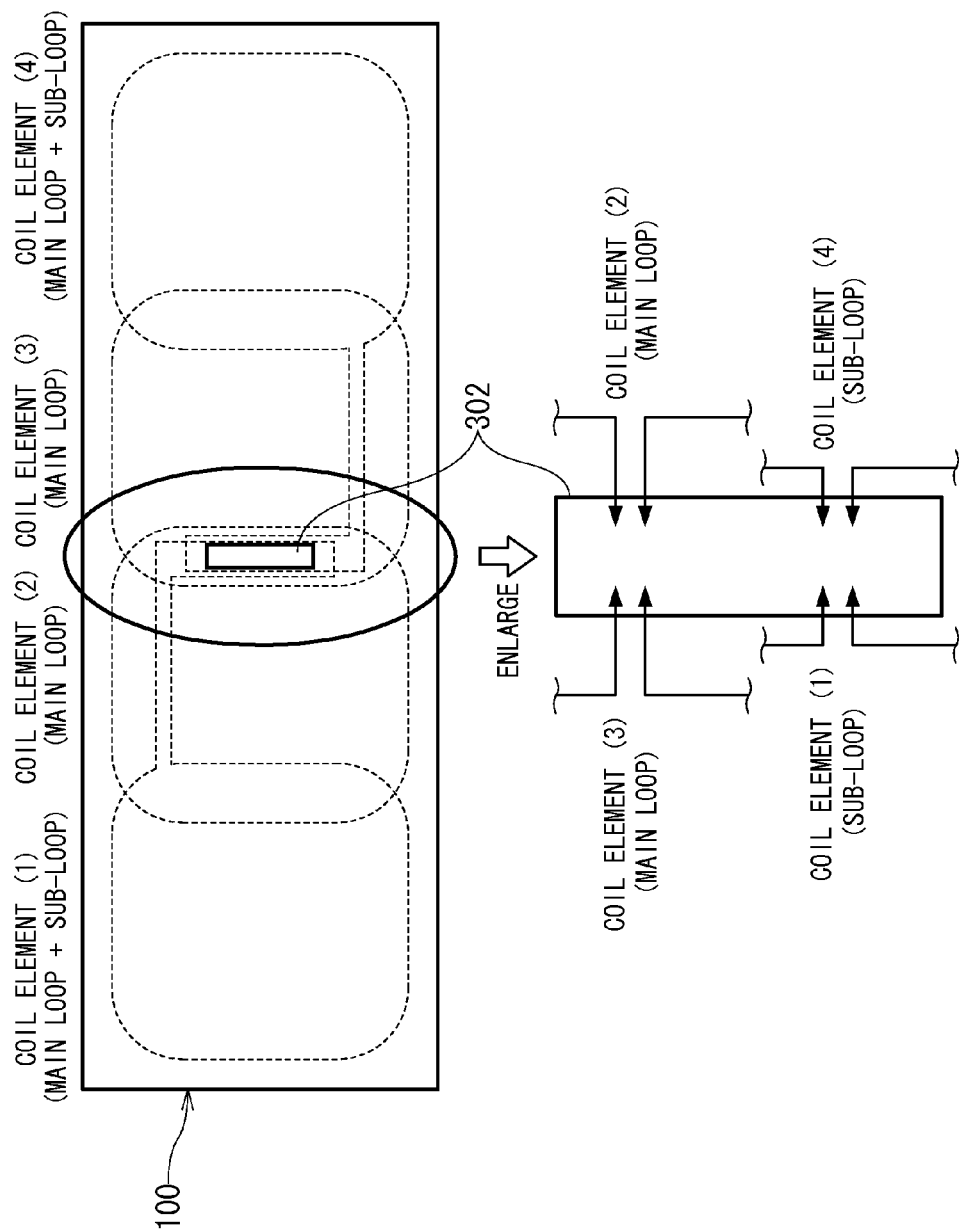
FIG. 15 shows an exemplary installation of a preamplifier unit that the RF coil unit has.

The RF coil unit 100 shown in an upper portion of FIG. 15 is the same as what is shown in FIG. 7 and is structured in such a way that the main loops, the sub-loops or a set of the main and sub-loops of any two of the coil elements (1) through (4) (i.e., of every combination of two of them) overlap without exception. The two coil elements (2) and (3) arranged in the middle are each a first coil element 101a having a main loop only. The coil elements (1) and (4) arranged at the both ends are each a second coil element 101b having a main loop and a sub-loop. Then, all the coil elements (1) through (4) overlap one another in an area which includes a certain one and the same area in the middle of the RF coil unit 100 of the embodiment.

Meanwhile, the respective loops of the coil elements (1) through (4) are each connected to the preamplifier unit 302 in one and the same area where the respective loops overlap as shown in a lower portion of FIG. 15.

Figure 16:
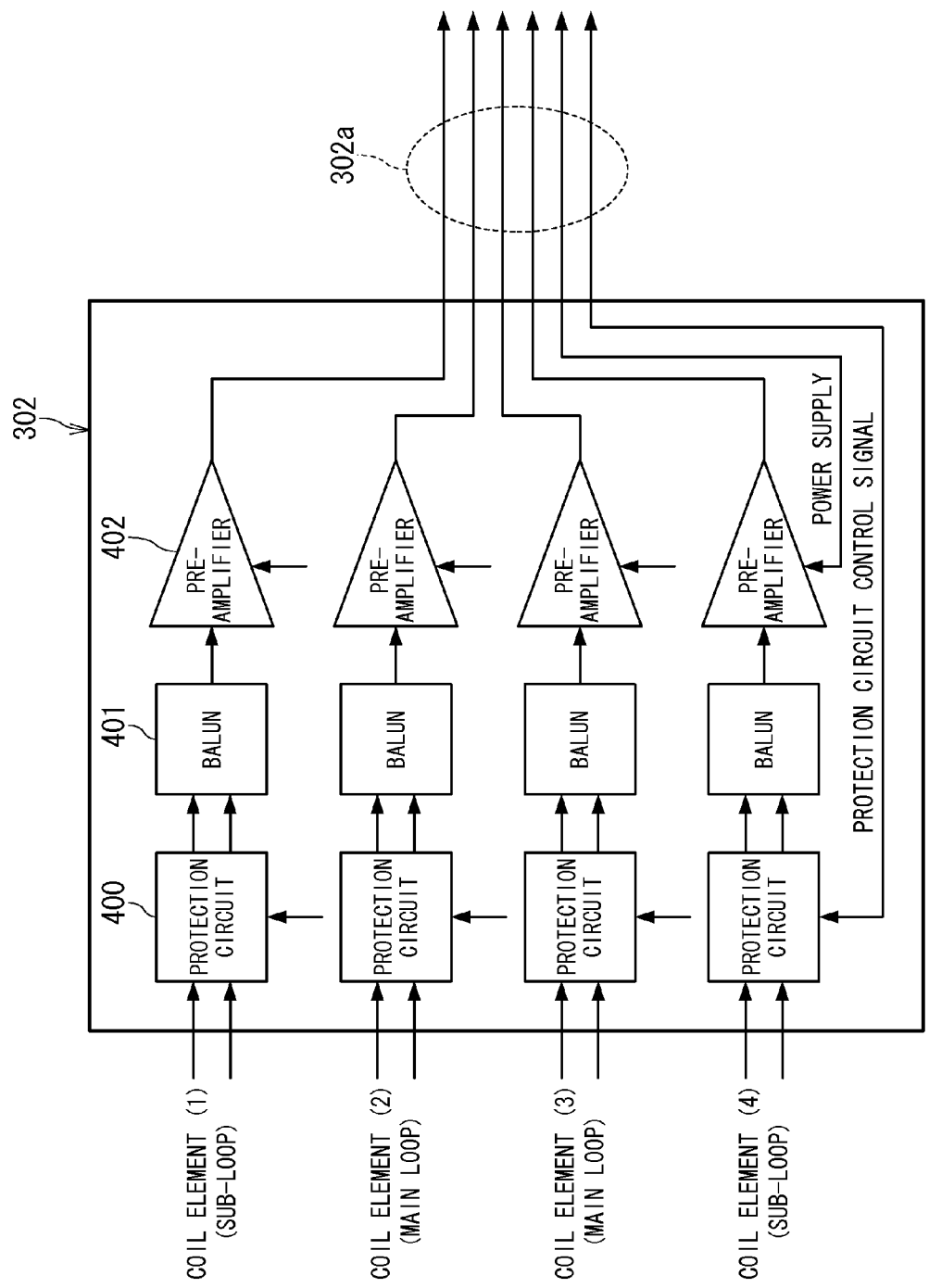
FIG. 16 shows an exemplary internal constitution of the preamplifier unit.

FIG. 16 shows an exemplary internal constitution of the preamplifier unit 302. The preamplifier unit 302 is structured in such a way that a protection circuit 400, a balun 401 and a preamplifier 402 are connected in series to each of the coil elements (1) through (4). The protection circuit 400 is a circuit, e.g., to turn a PIN diode, etc., on or off in response to a protection circuit control signal coming from the outside, to suppress high power in time of RF transmission and to protect the preamplifier 402. The balun 401 is a balanced-unbalanced conversion circuit which suppresses an unbalanced current (common mode noise) caused by a coil element (balanced circuit) being coupled with a preamplifier (unbalanced circuit).

The preamplifiers 402 each amplify a magnetic resonance signal received by one of the coil elements (1) through (4) under low noise condition, and each output an amplified signal to the outside via a coaxial cable, etc. The preamplifiers 402 are each supplied with power from the outside through a power supply line. Although FIG. 16 shows a constitution in which the preamplifiers 402 are each connected to one of the coil elements (1) through (4), the number of the preamplifiers 402 is not limited by such a constitution and can be properly changed.

Figure 17:
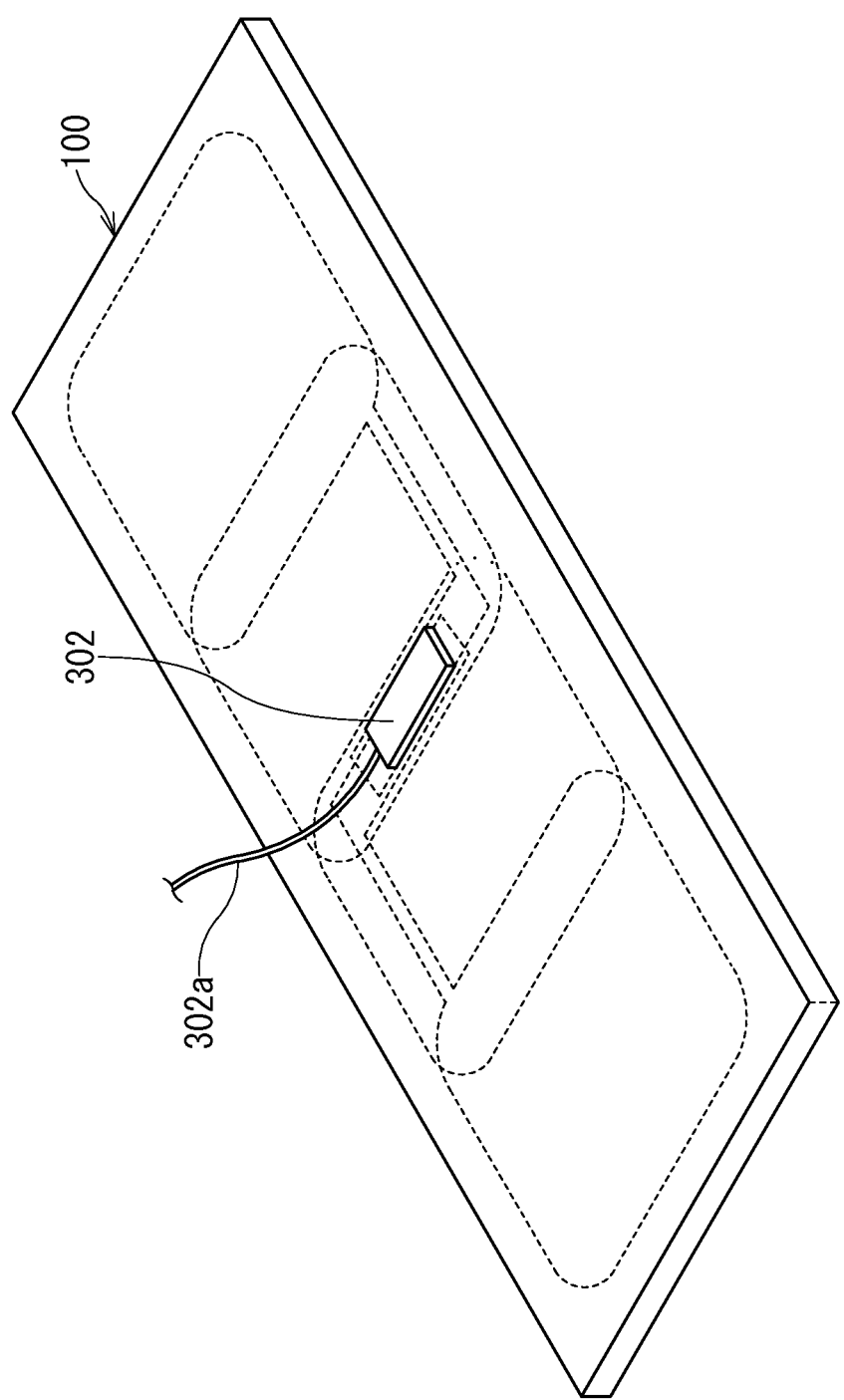
FIG. 17 is a perspective diagram which shows exemplary external appearances of the preamplifier unit and a complex cable.

FIG. 17 is a perspective diagram which schematically shows how the preamplifier unit 302 is arranged. The preamplifier unit 302 of the embodiment is arranged in such a way as to overlap an area which includes a certain one and the same area in the middle of the RF coil unit 100 as shown in FIG. 17. Coaxial cables which each output a magnetic resonance signal (four coaxial cables for this example), a power supply line, a protection circuit control signal, etc., are gathered in one complex cable which is connected to an outer connector of the preamplifier 302.

The RF coil unit 100 of the embodiment is structured in such a way that an electronic circuit including the preamplifiers 402 connected to the coil elements (1) through (4) individually, etc., is contained in one package (preamplifier unit 302) and that the preamplifiers 402 are arranged very close to all the coil elements (1) through (4) and connected in the preamplifier unit 302 as described above. The RF coil unit 100 of the embodiment has a feature of having a common area where all the loops of the coil elements (1) through (4) overlap at a same place, which enables the above structure of the preamplifier unit 302.

Even if respective coil elements of an ordinary RF coil unit overlap, areas where the coil elements overlap are not concentrated in one place but broken up in the RF coil unit.

Thus, an attempt to contain all the preamplifiers connected to the respective coil elements in one package causes a problem that all RF feeder lines (RF signal lines which couple the coil elements individually with the preamplifiers) cannot be connected with shortest line lengths. Thus, some of the RF feeder lines are extended long. A path from the coil element to the preamplifier formed by a long RF feeder line is less immune to incoming noise. Further, as a transmission loss of the RF feeder line increases, a noise figure worsens and an SNR of the magnetic resonance signal falls. Further, as a portion of the long RF feeder line may conceivably pass the plane of the loop of the coil element depending upon where and how the RF feeder line is laid, an RF characteristic specific to the coil element may possibly be spoiled.

Meanwhile, a structure such that the plural preamplifiers are divided into plural preamplifier units and that one preamplifier unit contains one preamplifier is conceivable, instead of a structure such that all the preamplifiers connected individually to the coil elements are contained in one package. Arranging the preamplifier units into which the preamplifiers are divided close to the respective coil elements, means it is possible to shorten the RF feeder lines coupling the coil elements and the preamplifiers individually. As the number of the preamplifier units increases, though, the structure invites higher cost. Further, complex cables including coaxial cables, etc., are pulled out from the respective preamplifier units. As the number of the complex cables increases, not merely handling of the cables becomes more complicated but a portion of the complex cables may possibly pass the plane of the loop of the coil element. In such a case, an RF characteristic specific to the coil element can be spoiled.

By contrast, the RF coil unit 100 of the embodiment is structured in such a way that all electronic circuits including the preamplifiers 402 connected to the coil elements (1) through (4) individually, etc., are contained in one package (preamplifier unit 302) and that the preamplifiers 402 are each arranged very close to all the coil elements (1) through (4) and connected in the preamplifier unit 302 as described above. Thus, all the RF feeder lines can be made shortest and immune to incoming noise. Further, as the transmission loss of the RF feeder line is small, the noise figure does not worsen and the SNR of the magnetic resonance signal does not fall. Further, as the coil elements (1) through (4) are each substantially directly coupled with the preamplifier unit 302, the preamplifier unit 302 does not need external RF feeder lines and the RF characteristic of the coil element can be prevented from being degraded because of the RF feeder line passing the plane of the loop of the coil element.

In addition, as the preamplifier unit 302 can be structured in one package, the number of the complex cables passing out from the preamplifier unit 302 is one. As a result, not merely the cost of the RF coil unit 100 can be kept low, but handling of the complex cable becomes simple and the RF characteristic of the coil element can be prevented from being degraded because of a portion of the complex cable passing the plane of the loop of the coil element.

Figure 18:
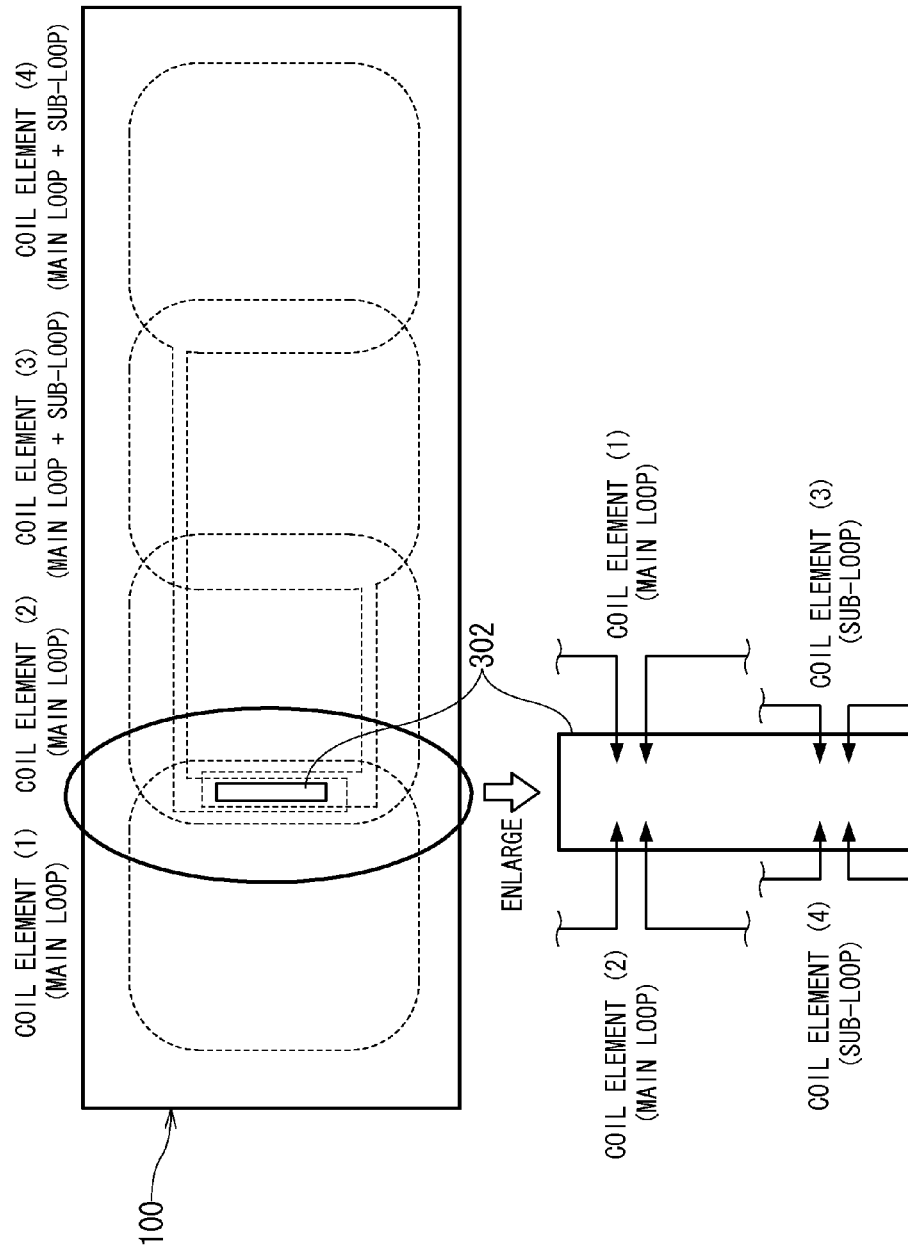
FIG. 18 shows another exemplary installation of the preamplifier unit.

The location where the preamplifier unit 302 is arranged may change depending upon the location of the common area where the coil elements overlap. The drawing shown in the upper portion of FIG. 18, e.g., is the same as what is shown in FIG. 12. The location of the common area of the example where the coil elements overlap is not in the middle but is shifted from the middle to the left, though. In this case, the preamplifier unit 302 is shifted to the left and arranged as shown in FIG. 18, and this arrangement produces the same effect as that of the RF coil unit 100 described above without a change.

Some embodiments of the invention are explained. These embodiments are presented as exemplary only, and it is not intended to limit the scope of the invention. These embodiments can be implemented in other various forms, and various omissions, replacements and changes are allowable within the scope of the invention. These embodiments and their modifications are within the coverage and scope of the invention, and similarly within the coverage of the invention written in the claims and equivalents.

What is claimed is:
1. An RF coil unit comprising:
 a plurality of first coil elements each having a first main loop which receives a magnetic resonance signal; and
 a plurality of second coil elements each having a second main loop and a sub-loop protruding from a portion of the second main loop, the sub-loop being connected with the second main loop in series, wherein all combinations of two coil elements which are chosen from all the plural first coil elements and the plural second coil elements included in the RF coil unit, are arranged such that areas surrounded by one and another one of the two coil elements overlap in such a way that an overlap area is located in an area surrounded by one of the first main loop and the second main loop.

2. The RF coil unit according to claim 1, wherein the overlap area is set in such a way that a magnetic field generated upon a current flowing through the one of the two coil elements which crosses the other of the two coil elements is reduced.

3. The RF coil unit according to claim 1, wherein the plural first coil elements and the plural second coil elements are lined up.

4. The RF coil unit according to claim 3, wherein the total number of the plural first coil elements and the plural second coil elements is equal to or more than four.

5. The RF coil unit according to claim 4, wherein the first coil elements are each arranged in such a way that an area surrounded by the first main loop of the relevant first coil element overlaps an area surrounded by the first or second main loop of the other of the two coil elements, or that an area surrounded by the first main loop of the relevant first coil element overlaps an area surrounded by the sub-loop of the other of the two coil elements being one of the second coil elements.

6. The RF coil unit according to claim 4, wherein the second coil elements are each arranged in such a way, upon the other of the two coil elements being adjacent to the relevant second coil element, that an area surrounded by the second main loop of the relevant second coil element overlaps an area surrounded by the first or second main loop of the other of the two coil elements, that an area surrounded by the second main loop of the relevant second coil element overlaps an area surrounded by the sub-loop of the other of the two coil elements being one of the second coil elements, or that an area surrounded by the sub-loop of the relevant second coil element overlaps an area surrounded by the sub-loop of the other of the two coil elements being one of the second coil elements.

7. The RF coil unit according to claim 4, wherein the second coil elements are each arranged in such a way, upon the other of the two coil elements being other than adjacent to the relevant second coil element, that an area surrounded by the sub-loop of the relevant second coil element overlaps an area surrounded by the first or second main loop of the other of the two coil elements or that an area surrounded by the sub-loop of the relevant second coil element overlaps an area surrounded by the sub-loop of the other of the two coil elements being one of the second coil elements.

8. The RF coil unit according to claim 6, wherein a combination of any two of the plural second coil elements having an area in which the sub-loops of the relevant second coil elements overlap is set including one and the same particular area without exception.

9. The RF coil unit according to claim 8, wherein the same particular area is arranged in the middle of the RF coil unit.

10. The RF coil unit according to claim 7, wherein a combination of any two of the plural second coil elements having an area in which the sub-loops of the relevant second coil elements overlap is set including one and the same particular area without exception.

11. The RF coil unit according to claim 10, wherein the same particular area is arranged in the middle of the RF coil unit.

12. The RF coil unit according to claim 1 further comprising, wherein the first coil elements and the second coil elements are lined up and the RF coil unit is formed like a flexible sheet, a holding member which holds a shape of the sheet-like formed RF coil unit being bent along a test object.

13. An RF coil complex including a plurality of RF coil units each being defined according to claim 8, a combination of any two of the RF coil units comprising:
a first local loop located in an area of one of the RF coil units which overlaps the same particular area;
a second local loop located in an area of another one of the RF coil units which overlaps the same particular area; and
a line which couples the first local loop with the second local loop.

14. A RF coil complex including a plurality of RF coil units each being defined according to claim 10, a combination of any two of the RF coil units comprising:
a first local loop located in an area of one of the RF coil units which overlaps the same particular area;
a second local loop located in an area of another one of the RF coil units which overlaps the same particular area; and
a line which couples the first local loop with the second local loop.

15. An MRI apparatus comprising the RF coil unit according to claim 1.

16. The RF coil unit according to claim 1 further comprising:
a preamplifier unit connected with the plural first coil elements and the plural second coil elements, the preamplifier unit having at least one preamplifier per one of the first and second coil elements which amplifies a magnetic resonance signal received by the relevant first or second coil element, wherein
the preamplifier unit is arranged as overlapping an area including the overlap area.

17. The RF coil unit according to claim 1 further comprising:
a preamplifier unit connected with the plural first coil elements and the plural second coil elements, the preamplifier unit having at least one preamplifier per one of the first and second coil elements which amplifies a magnetic resonance signal received by the relevant first or second coil element, wherein
at least one of the first coil elements and at least one of the second coil elements overlap in an area including one and the same area, and
the preamplifier unit is arranged as overlapping an area including the one and the same area.

18. The RF coil unit according to claim 16, wherein a plurality of RF signals each provided by the respective plural preamplifiers and a plurality of power supply lines for supplying the plural preamplifiers with power are gathered in one complex cable and provided from the preamplifier unit to the outside.

19. The RF coil unit according to claim 17, wherein a plurality of RF signals each provided by the respective plural preamplifiers and a plurality of power supply lines for supplying the plural preamplifiers with power are gathered in one complex cable and provided from the preamplifier unit to the outside.

* * * * *